United States Patent
Tang et al.

(10) Patent No.: US 9,893,286 B2
(45) Date of Patent: Feb. 13, 2018

(54) ORGANIC SINGLE CRYSTAL FIELD EFFECT CIRCUIT AND PREPARING METHOD THEREOF

(71) Applicant: NORTHEAST NORMAL UNIVERSITY, Changchun, Jilin (CN)

(72) Inventors: Qingxin Tang, Jilin (CN); Yichun Liu, Jilin (CN); Yanhong Tong, Jilin (CN); Xiaoli Zhao, Jilin (CN)

(73) Assignee: Northeast Normal University, Changchun, Jilin (CN)

( * ) Notice: Subject to any disclaimer, the term of this patent is extended or adjusted under 35 U.S.C. 154(b) by 0 days.

(21) Appl. No.: 14/910,604

(22) PCT Filed: Jun. 26, 2015

(86) PCT No.: PCT/CN2015/000461
§ 371 (c)(1),
(2) Date: Feb. 5, 2016

(87) PCT Pub. No.: WO2016/008277
PCT Pub. Date: Jan. 21, 2016

(65) Prior Publication Data
US 2017/0125681 A1    May 4, 2017

(30) Foreign Application Priority Data
Jul. 17, 2014  (CN) .......................... 2014 1 0341757

(51) Int. Cl.
*H01L 51/10* (2006.01)
*H01L 51/00* (2006.01)
*H01L 51/05* (2006.01)

(52) U.S. Cl.
CPC ...... *H01L 51/0021* (2013.01); *H01L 51/0023* (2013.01); *H01L 51/0094* (2013.01);
(Continued)

(58) Field of Classification Search
CPC .............. H01L 51/105; H01L 51/0508; H01L 51/0512; H01L 51/0021
See application file for complete search history.

(56) References Cited

U.S. PATENT DOCUMENTS

| 6,080,606 A * | 6/2000 | Gleskova ............ G02F 1/13439 |
|   |   | 257/E21.413 |
| 8,475,671 B2 * | 7/2013 | Jalabert ............... B81C 1/00206 |
|   |   | 216/41 |

FOREIGN PATENT DOCUMENTS

| CN | 101931052 A | 12/2010 |
| CN | 103000809 A | 3/2013 |

(Continued)

*Primary Examiner* — Jose R Diaz
(74) *Attorney, Agent, or Firm* — Knobbe, Martens, Olson & Bear, LLP

(57) ABSTRACT

The present invention provides an organic single crystal field effect circuit and method for preparing the same. The method comprises the steps of: preparing circuit masks; preparing a flexible planar embedded lamination electrode with the circuit patterns: 1) attaching octadecyl trichlorosilane on surface of a substrate; 2) preparing the source, drain and gate electrodes on the modified substrate, and attaching mercaptopropyl trimethoxysilane; 3) spin-coating polydimethyl siloxane on surfaces of the source, drain and gate electrodes, respectively; 4) removing the gate electrode spin-coated with polydimethyl siloxane, performing oxygen plasma treatment to the metal electrode surface of the gate electrode and polydimethyl siloxane surfaces of the source and drain electrodes, respectively, to form hydroxyl; 5) adjusting the source and the drain electrodes, attaching the gate, source and drain electrodes into an integration, thereby obtaining the flexible planar embedded lamination electrode; preparing the organic single crystal field effect circuit. The present invention prepares electrodes using photolithography technique with high precision such that patterns with (Continued)

high precision and high complexity can be prepared, which is convenient and practicable.

10 Claims, 7 Drawing Sheets

(52) U.S. Cl.
CPC ........ *H01L 51/0097* (2013.01); *H01L 51/055* (2013.01); *H01L 51/105* (2013.01); *H01L 51/0054* (2013.01); *H01L 51/0078* (2013.01); *H01L 51/0558* (2013.01)

(56) References Cited

FOREIGN PATENT DOCUMENTS

| | | | |
|---|---|---|---|
| CN | 103280527 A | * | 9/2013 |
| CN | 103890988 A | | 6/2014 |
| CN | 104112819 A | | 10/2014 |
| JP | 2008-258558 A | | 10/2008 |

* cited by examiner

ORGANIC SINGLE CRYSTAL FIELD EFFECT CIRCUIT AND PREPARING METHOD THEREOF

CROSS-REFERENCE TO RELATED APPLICATIONS

This application is the U.S. National Phase under 35. U.S.C. § 371 of International Application PCT/CN2015/000461, filed Jun. 26, 2015, which claims priority to Chinese Patent Application No. 201410341757.7, filed Jul. 17, 2014. The disclosures of the above-described applications are hereby incorporated by reference in their entirety.

FIELD

The present invention relates to an organic single crystal field effect circuit and a preparation method thereof, belonging to the field of organic electronics.

BACKGROUND

After the rapid development of inorganic integrated circuits, a first organic circuit in a real sense did not appear until 1995 when the Philips Laboratory achieved a series of basic circuit units such as inverter using pentacene and polyvinyl thiophene, etc. (*Science* 1995, 270, 972), thus stirring up a new chapter of studying organic field effect circuit. Organic materials have many inherent advantages, such as simple film formation and fabrication process, wide source of materials, good compatibility with flexible substrates, and easy modulation of electrical properties, compared with inorganic materials (*Nature*, 2001, 414, 599; *Chemical Reviews* 2012, 112, 2208; *Nature* 2013, 499, 458; *Journal of the American Chemical Society* 2004, 126, 8138). Thus, the research of organic field effect transistors and circuits had got a rapid development and progress in the past decade. In recent years, the research of organic field effect circuits mainly focuses on preparation of organic thin film field effect circuits (*Applied Physics Letters* 1998, 72, 2716; *Advanced Materials* 2003, 15, 1147; *Nature Materials* 2003, 2, 678; *Chemistry of Materials* 2011, 23, 733). However, there are a large number of grain boundaries and high-density structural defects in organic thin films, which can significantly impact performance of devices and circuits (*Advanced Materials* 2006, 18, 2320). The appearance of organic single crystal becomes a solution to this problem. Since organic single crystal has no grain boundary and has a good $\pi$-$\pi$ orbital overlap, the trapping density of charge can be reduced effectively. Therefore, it is possible to prepare an organic single crystal field effect circuit, to improve device performance.

Currently, few articles put emphasis on preparation of organic single crystal field effect circuits, which can be divided into two categories based on different configurations of a device (that is, the up-down position between a source/drain electrode and a semiconductor), one is top-contact organic single crystal field effect circuits (*Advanced Materials* 2009, 21, 3649; *Advanced Materials* 2009, 21, 4234; *Applied Physics Letters* 2009, 94, 203304; *Advanced Materials* 2010, 22, 3938; *Advanced Materials* 2012, 24, 2588), and the other is bottom-contact organic single crystal field effect circuits (*Applied Physics Letters* 2006, 89, 222111; *Nano Letter* 2007, 7, 2847). For the first category of top-contact organic single crystal field effect circuits, Hu Wenping Research Group has prepared a bootstrap inverter by vacuum depositing gold as electrodes using nanobelt which serves as a mask based on two single crystals of anthracene derivative (*Advanced Materials* 2009, 21, 3649). Uemura Research Group has prepared a complementary inverter by vacuum depositing gold and calcium as electrodes based on a single crystal of single rubrene (*Advanced Materials* 2010, 22, 3938). Bao Zhenan Research Group has obtained basic circuit units of an inverter by preparing $C_{60}$ and TIP S-pentacene single crystal on a silicon dioxide substrate with a liquid phase method, and then vacuum depositing gold as electrodes (*Advanced Materials* 2012, 24, 2588). They are common in preparing top-contact organic single crystal field effect circuits directly on organic single crystals by means of a conventional approach of vacuum mask deposition. However, this approach has several drawbacks. On one hand, prepared electrodes have larger size, wires are less precise, shapes of patterns are limited, and complex patterns cannot be prepared. On the other hand, during deposition of an electrode, thermal radiation may cause some damage to an organic semiconductor (*Advanced Materials* 2008, 20, 2947; *Advanced Materials* 2008, 20, 1511), thus affecting performance of a device. In order to address the above drawbacks of the approach of vacuum mask deposition, Hu Wenping Research Group also proposed two approaches: "gold film stamp" and "Nanobelt electrode" for preparing an organic single crystal circuit (*Applied Physics Letters* 2009, 94, 20304; *Advanced Materials* 2009, 21, 4234), which successfully avoid damages of heat radiation to an organic semiconductor. Since such approach prepares a device by using a probe to micro-manipulate a gold film and a nanobelt electrode, it is only suitable for preparing a single device, and not suitable for preparing a more complex circuit, thus not having high integration level. In order to solve problems such as heat radiation damage and low integration level when preparing top-contact organic single crystal circuits, the researchers further develop the second category of bottom-contact organic single crystal field effect circuits. Bao Zhenan Research Group has prepared a complementary inverter on a silicon dioxide substrate based on n-type and p-type organic single crystals (*Applied Physics Letters* 2006, 89, 222111; *Nano Letter* 2007, 7, 2847). The features of this approach are: firstly, preparing electrodes on a substrate with photolithography or an approach of vacuum mask deposition, and then combining organic single crystals with the electrodes and an insulating layer via electrostatic force, to finally form a device. The advantage of this approach is that it can address the problems of heat radiation damage and low integration level. However, this approach also has some drawbacks: on one hand, in structure of an organic single crystal field effect circuit with bottom-contact reported presently (as shown in FIG. 1), the configuration that electrodes protruding from a surface of an insulating layer is more suitable for crystals with larger size such that sizes of used crystals are limited. When an organic micro/nano semiconductor is placed onto the electrodes, as shown in FIG. 2, the configuration that electrodes protruding from the surface of the insulating layer may result in incomplete fit between the organic single crystal and the insulating layer, thereby resulting in electrode steps. Further, due to poor conductivity of an organic semiconductor, it is difficult to transport carriers in the unfitted portion, which may cause field effect performance of the device to degrade, and even cause the device to lose field effect performance. On the other hand, the presently reported bottom-contact organic single crystal field effect circuits are prepared on rigid substrates, which may cause contact quality between the semiconductor and electrodes to be poor, and may cause a defect to be produced, resulting in reduced device performance. Therefore, it is desirable to provide a novel method for preparing an organic single crystal field effect circuit that can eliminate heat radiation damage to the organic semiconductor and can achieve an organic single crystal with high performance, flexibility, high integration, and applicability to various sizes.

SUMMARY

The purpose of the present invention is to provide a method for preparing an organic single crystal field effect circuit. The method of the present invention can prevent solution and radiation from polluting and damaging the organic semiconductor. The method of the present invention can ensure complete fit between the organic semiconductor and electrodes and an insulating layer, thereby achieving a device with high performance; high integration level, thereby it is possible to prepare a complex pattern; and organic single crystals applicable to various sizes.

The method provided in the present invention for preparing an organic single crystal field effect circuit comprises steps of:

(1) preparing circuit masks, comprising steps of:

1) designing circuit mask patterns of a source electrode, a drain electrode and a gate electrode, respectively, with L-editor software;

2) etching, on quartz or glass spin-coated with polymethyl methacrylate, the circuit mask patterns obtained from the step 1) with a method of laser direct writing; then evaporating chromium, and removing the polymethyl methacrylate, to obtain the circuit masks of the source, drain electrode and gate electrodes;

(2) preparing a flexible planar embedded lamination electrode with circuit pattern, comprising steps of:

1) attaching octadecyl trichlorosilane on a substrate surface;

2) preparing the source, drain and gate electrodes, respectively, on the substrate modified by the step 1), by means of photolithography and the circuit masks obtained from step (1); and attaching mercaptopropyl trimethoxysilane on metal electrode surfaces of the source, drain and gate electrodes;

3) spin-coating polydimethyl siloxane on surfaces of the source, drain and gate electrodes obtained from step 2), respectively, and then curing;

4) removing the gate electrode spin-coated with polydimethyl siloxane from the substrate; performing oxygen plasma treatment on the metal electrode surface of the gate electrode and polydimethyl siloxane surfaces of the source and drain electrodes, respectively, thereby forming hydroxyl on the these surfaces;

5) adjusting the source and the drain electrodes; aligning and heating the metal electrode surface of the gate electrode and polydimethyl siloxane surfaces of the source and drain electrodes (using a pre-designed aligned coordinate pattern under a microscope, performing surface attachment) to attach the gate, source and drain electrodes into an integration, thereby obtaining the flexible planar embedded lamination electrode;

(3) preparing the organic single crystal field effect circuit, comprising steps of:

placing the organic single crystal on the flexible planar embedded lamination electrode obtained from the step (2) so as to obtain the organic single crystal field effect circuit.

In the preparation method described above, when aligning, the metal electrode surface of the gate electrode is affixed onto the polydimethyl siloxane surfaces of the source and drain electrodes.

In the preparation method described above, in the step (1) 2), conditions of the laser direct writing and the thickness of the evaporated chromium may make reference to those of existing methods.

In the preparation method described above, in the step (2) 1), the steps of attaching octadecyltrichl orosilane are as follows: placing the cleaned substrate into a mixed solution of concentrated sulfuric acid and hydrogen peroxide with a volume ratio of 7:3; then cleaning the substrate, and putting the substrate into a mixed solution of n-heptane and octadecyl trichlorosilane with a volume ratio of 1000:1, thereby attaching the octadecyl trichlorosilane to the substrate surface.

In the preparation method described above, in the step (2) 2), the steps of photolithography are as follows: spin-coating photoresist on the substrate, exposing the substrate to a ultraviolet (UV) light of 365 nm after heating, and evaporating metal after sequentially performing developing and fixing, which may be specifically performed as the following steps:

spin-coating a layer of photoresist AZ5214E onto the substrate; heating the substrate spin-coated with photoresist on a baking table at 100° C. for 3 min; then exposing the heated substrate spin-coated with photoresist to a UV light of 365 nm for 20 seconds; placing the exposed substrate in a developer for developing for 60 seconds; fixing the substrate with deionized water for 30 seconds; evaporating metal of 25 nm on the photolithographically patterned substrate using a method of vacuum thermal evaporation; and finally removing the photoresist with stripping liquid to form a patterned metal;

attaching the mercaptopropyl trimethoxysilane to the metal electrode surface using vacuum gas phase.

In the preparation method described above, in the step (2) 3), the thickness of the polydimethyl siloxane spin-coated on the gate electrode may be 50-500 μm. The thickness of the polydimethyl siloxane spin-coated on the source and drain electrodes may be 0.8-5 μm. The temperature for curing may be 70-100° C., and the time for curing may be 2-12 h.

In the preparation method described above, in the step (2) 4), the time for oxygen plasma treatment may be 10-60 s.

In the preparation method described above, in the step (2) 5), the temperature for heating may be 70-100° C., and the time for heating may be 10-30 min.

In the preparation method described above, the organic single crystal is phthalocyanine copper organic single crystal or rubrene organic single crystal. The length of the phthalocyanine copper organic single crystal is 10-1000 μm, the width thereof is 0.3-100 μm, and the thickness thereof is 0.02-10 μm. The length of the rubrene organic single crystal is 30-5000 μm, the width thereof is 0.5-500 μm, and the thickness thereof is 0.05-30 μm.

The present invention further provides an organic single crystal field effect circuit prepared by the method described above.

The present invention further provides a method for preparing a flexible organic single crystal field effect circuit, comprising steps of: in the above method for preparing an organic single crystal field effect circuit, step (3) further comprises affixing the flexible planar embedded lamination electrode to a spherical surface before placing the organic single crystal on the flexible planar embedded lamination electrodes obtained from step (2), thereby obtaining the flexible organic single crystal field effect circuit.

The present invention further provides a flexible organic single crystal field effect circuit prepared by the method described above.

The organic single crystal field effect circuit of the present invention may also be used for attaching an external circuit, which may be specifically performed as the following steps: attaching the organic single crystal circuit to an external circuit using a method of oxygen plasma, removing down the external electrode layer with PDMS, covering the organic single crystal with a gold film which serves as a mask, and then oxygen plasma treating the flexible planar embedded lamination electrodes with circuit patterns and the surface of the external electrode layer such that hydroxyl is formed on the surfaces; removing the gold film with a probe station; aligning the lamination electrode layer with organic semiconductor and the external electrode layer using aligned patterns under a microscope, and heating, thereby finally achieving the attachment of the organic single crystal circuit and the external circuit.

The present invention provides the following advantages: the organic single crystal field effect circuit of the present invention is a flexible organic single crystal field effect circuit with high performance in that electrodes are embedded electrodes that are located in the same plane as the insulating layer and are flexible such that a complete fit between the electrodes, the insulating layer and the organic single crystal can be achieved; the preparation method provided in the present invention can be operated at a room temperature such that the organic semiconductor is free from damage of thermal radiation; the method provided in the present invention prepares electrodes using photolithography technique with high precision such that patterns with high precision and high complexity can be prepared, thereby achieving high integration level and easy-to-use; the method provided in the present invention can achieve the preparation of a flexible circuit.

BRIEF DESCRIPTION OF THE DRAWINGS

FIG. 8 (b) are output voltage curve and gain curve of the phthalocyanine copper single crystal field effect inverter; FIG. 8 (c) is a transfer curve of a drive device of the phthalocyanine copper single crystal field effect inverter; and FIG. 8 (d) is a transfer curve of a load device of the phthalocyanine copper single crystal field effect inverter.

FIG. 9 are microscope figures and transfer curves of the flexible planar embedded lamination electrodes applied into the phthalocyanine copper organic single crystal field effect transistor prepared by embodiment 1 of the present invention, which may be reused; wherein FIGS. 9 (a) and 9 (b) are microscope figure and transfer curve of a device on the laminations electrodes, respectively, FIGS. 9 (c) and 9 (d) are microscope figure and transfer curve of a substituted nanowire of phthalocyanine copper nanowires on the same lamination electrode, respectively.

FIG. 11 (a) is a physical map of the rubrene single crystal field effect inverter; FIG. 11 (b) are output voltage curve and gain curve of the rubrene single crystal field effect inverter; FIG. 11 (c) is a transfer curve of a drive device of the rubrene single crystal field effect inverter; and FIG. 11 (d) is a transfer curve of a load device of the rubrene single crystal field effect inverter.

FIG. 12 (a) is a physical map of the rubrene single crystal field effect inverter; FIG. 12 (b) are output voltage curve and gain curve of the rubrene single crystal field effect inverter; FIG. 12 (c) is a transfer curve of a drive device of the rubrene single crystal field effect inverter; and FIG. 12 (d) is a transfer curve of a load device of the rubrene single crystal field effect inverter.

FIG. 13 (a) is a three-dimensional microscope figure of the rubrene single crystal flexible inverter on the spherical surface; FIG. 13 (b) is a microscope figure of the rubrene single crystal flexible inverter on the spherical surface; FIG. 13 (c) are static voltage output curve and the corresponding gain curve of the rubrene single crystal flexible inverter on the spherical surface; FIG. 13 (d) is dynamic voltage output curve of the rubrene single crystal flexible inverter on the spherical surface.

DETAILED DESCRIPTION

Figure 1:
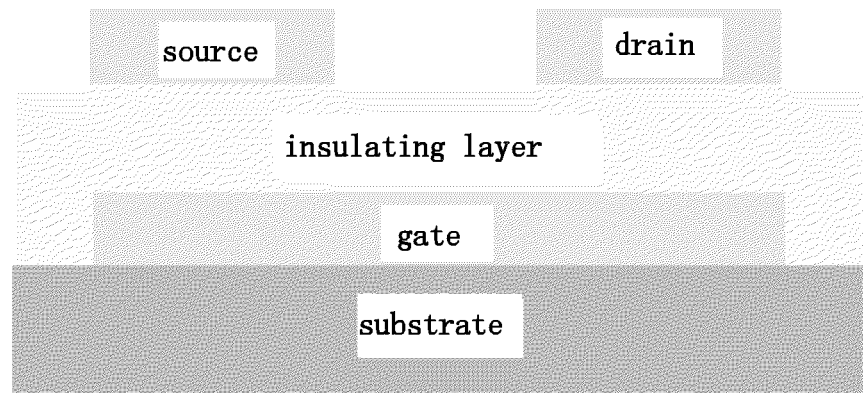
FIG. 1 is a schematic diagram of structure of a prior bottom-gate bottom-contact electrode.
Figure 2:
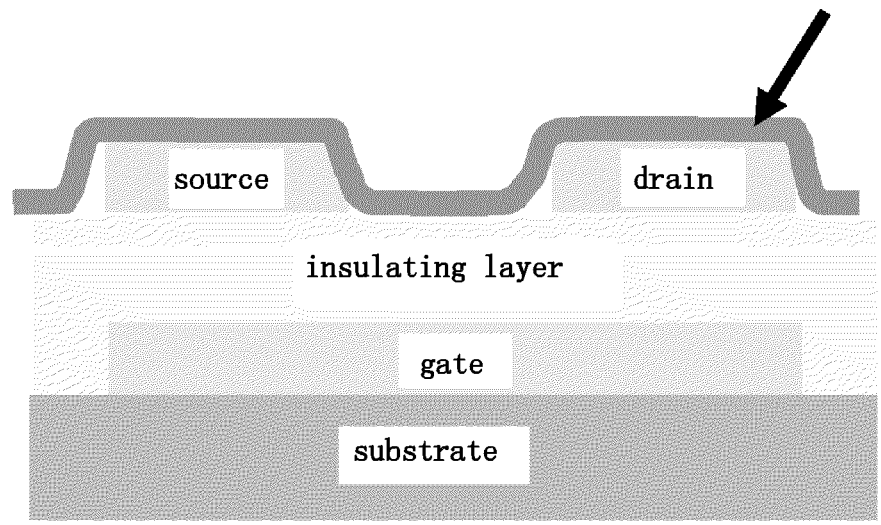
FIG. 2 is a schematic diagram showing the contact of a prior organic micro/nano single crystal semiconductor and a traditional bottom-gate bottom-contact electrode.
Figure 3:
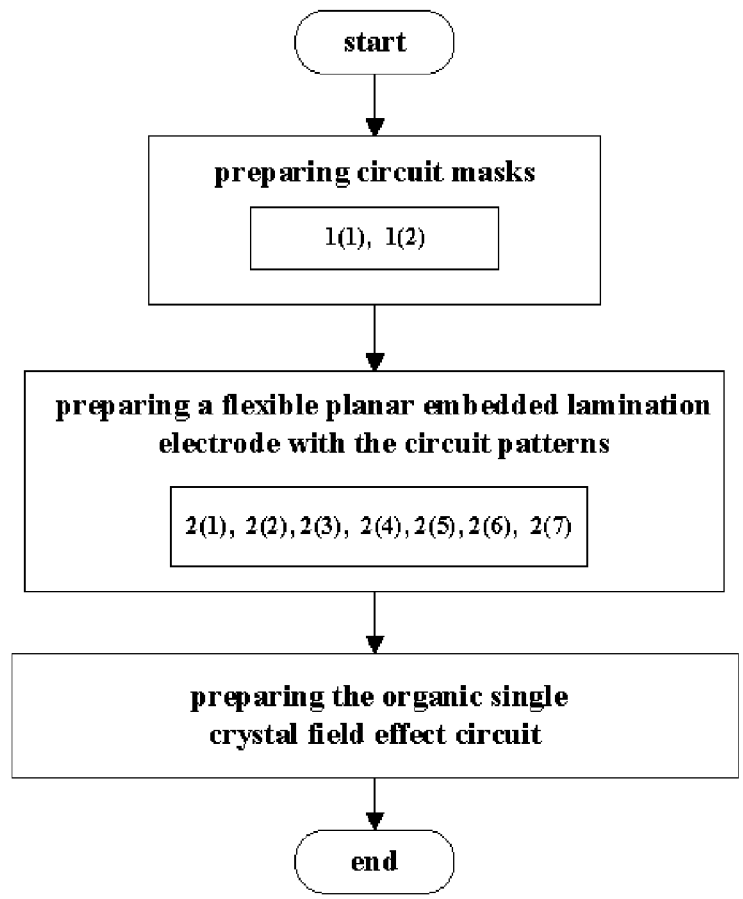
FIG. 3 is an example flow chart of a method for preparing the organic single crystal field effect circuit according to an embodiment of the invention.
Figure 4:
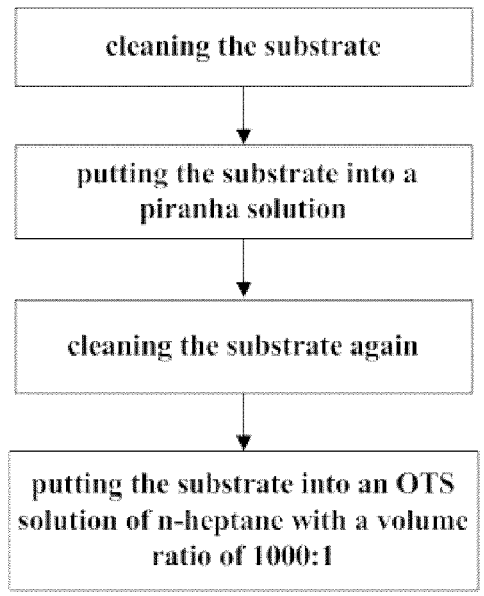
FIG. 4 is an example flow chart of a process for attaching octadecyl trichloro silane according to an embodiment of the invention.
Figure 5:
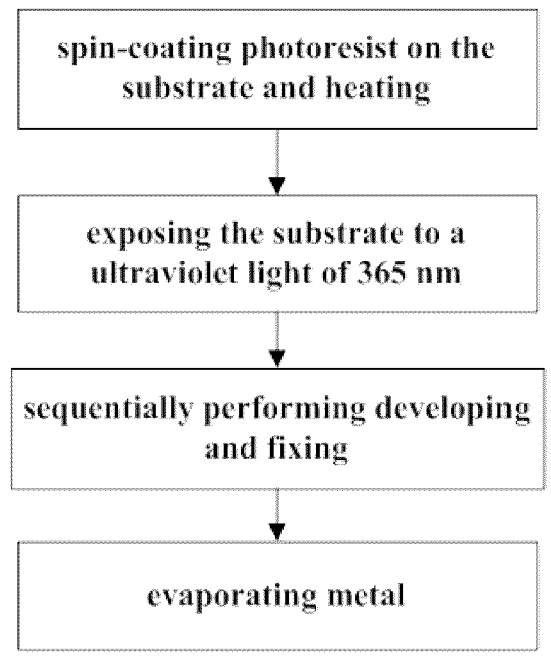
FIG. 5 is an example flow chart of a process for photolithography according to an embodiment of the invention.

The preferred embodiments will be described with reference to flow charts shown in FIGS. 3-5. The experimental methods described in the following embodiments are conventional methods, unless otherwise specified.

Embodiment 1 Preparation of Phthalocyanine Copper Organic Single Crystal Field Effect Circuit 1. Preparation of Circuit Masks
(1) Designing circuit mask patterns of source electrode, drain electrode, gate electrode and external electrode using L-editor software, respectively; wherein each layer is designed to have a same aligning pattern for the following alignment of the plurality of electrodes.

(2) The circuit masks used in the embodiment is commercially available from Nanjing Microclear electronics Technology Co., Ltd., the specific process is: spin-coating polymethyl methacrylate on a quartz, etching the circuit mask patterns obtained from step (1) with the method of laser direct writing; then evaporating chromium (100 nm) and removing the polymethyl methacrylate, thereby obtaining the circuit masks of the source, drain, gate and external electrodes.

2. Preparation of Flexible Planar Embedded Lamination Electrode with an Inverter Pattern (1) Modifying a layer of octadecyl trichloro silane OTS on the substrate silicon surface using liquid-phase method: modifying the silicon surface with octadecyl trichloro silane OTS: firstly cleaning the substrate surface; then putting the substrate into a piranha solution (i.e., solution of concentrated sulfuric acid and hydrogen peroxide with a volume ratio of 7:3) to form hydroxylation on the substrate surface; cleaning the substrate again; putting the substrate into an OTS solution of n-heptane with a volume ratio of 1000:1 such that a layer of OTS is formed on the surface of the substrate.

(2) Preparing a source/drain electrode layer, a gate electrode layer, an external electrode layer of the circuit patterns, respectively, on the OTS-modified substrates using photolithography, and modifying the metal electrode surface with mercaptopropyl trimethoxy silane MPT: photoetching the source/drain electrode and the gate electrode on the substrate with photoresist AZ5214E firstly (baking temperature: 100 degrees, baking time: 3 min, exposure time: 20 seconds, developing time: 60 seconds, fixing time: 30 seconds); and then vacuum evaporating a layer of 25 nm gold (vacuum level: $10^{-6}$ torr; evaporating rate: 0.01 nm/s); modifying a layer of MPT molecule (1-5 nm) on the metal surface using vacuum gas-phase method before the photoresist is removed (specifically, simultaneously putting the source, drain, and gate electrodes and 30 μL mercaptopropyl trimethoxy silane into a vacuum system with a pressure of 7000 Pa for 20 min), with the purpose of enabling a good attachment between the polydimethyl siloxane PDMS and the metal, and facilitating the removing of the metal electrodes from the substrate surface; after the modification of MPT, removing the photoresist with a solution of N-methylpyrrolidone, with the purpose of modifying the MPT only on the metal surface, and the substrate surface has no MPT molecules.

(3) Spin-coating polydimethyl siloxanes (PDMS) with different thicknesses on the source/drain electrode layer, the gate electrode layer and the external electrode layer which have been photoetched and modified with MPT, respectively, and then curing.

Preparing PDMS solution at a ratio of 10:1 (PDMS: curing agent, volume ratio), then standing the solution for 2 hours after stirring. Spin-coating a layer of 200 μm PDMS solution directly on the gate electrode which has been photoetched and modified with MPT, and then putting it into a baking oven to heat and cure at 70 degrees for 12 hours; diluting the PDMS by pouring the stood PDMS into the solution of N-hexane, with a volume ratio 1:10, then stirring and standing; spin-coating a layer of n-hexane solution of 1 μm PDMS on the source/drain electrode which has been photoeched and modified with MPT, and then putting it into an baking oven for heating and curing at 70 degrees for 12 hours.

(4) Oxygen plasma treating the surfaces of the source/drain, gate electrodes: firstly, removing the PDMS with the gate down from the silicon substrate; then simultaneously putting the removed gate electrode and the source/drain electrode with PDMS into oxygen plasma for treating for 100 seconds, so that the surfaces, i.e., the surface of gate with metal electrode and the surface of the source/drain electrode with PDMS layer, are hydroxylated.

(5) Adjusting the source/drain electrode: adjusting the source/drain electrode with PDMS using a probe (for a fine electrode), with the purpose of facilitating following tests.

(6) Aligning and heating the gate electrode and the source/drain electrode: aligning the gate electrode and the source/drain electrode under a microscope using an aligning tool (which can achieve up, down, lift and down leveling); putting the aligned electrodes into a baking oven for heating at 70 degrees for 10 minutes, so that an irreversible bond is formed between the gate electrode and the source/drain electrode, making them attached tightly, with this, the PDMS layer of the source/drain electrode and the metal electrode surface of the gate are attached together.

Figure 6:
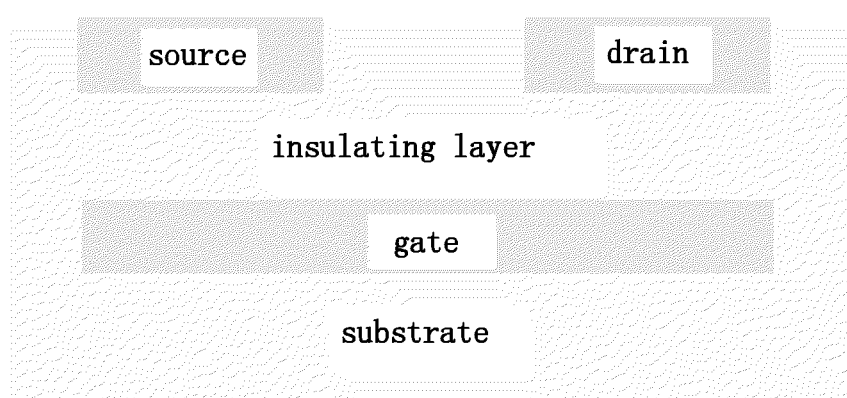
FIG. 6 is a schematic diagram of structure of flexible planar embedded lamination electrodes prepared by embodiment 1 of the present invention.

(7) Entirely removing down the source/drain electrode with thinner PDMS using the gate electrode with thicker PDMS, thereby forming a planar embedded lamination electrode. Since the good flexibility of the PDMS and metal, the formed electrodes, insulating layer and the substrate are fully flexible planar embedded lamination electrodes, as shown in FIG. 6.

Figure 7:
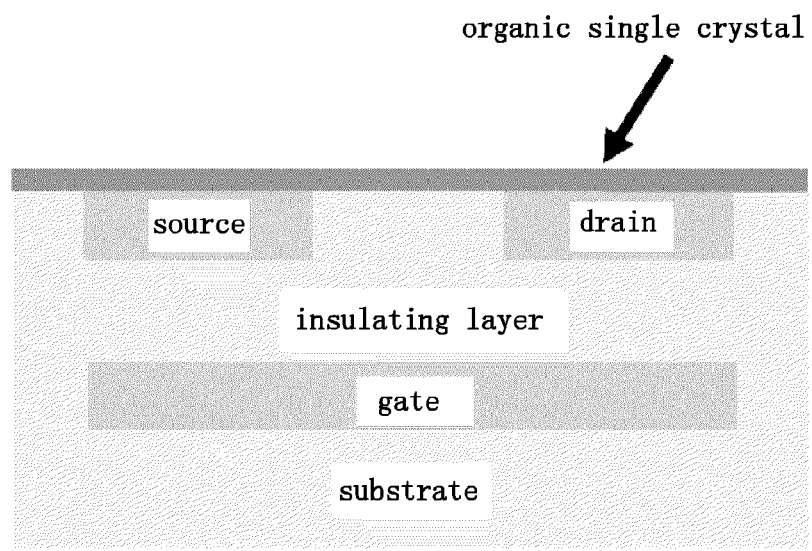
FIG. 7 is a schematic diagram of structure of a phthalocyanine copper organic single crystal field effect device prepared by embodiment 1 of the present invention.

3. Preparation of Phthalocyanine Copper Organic Single Crystal Field Effect Circuit Placing the phthalocyanine copper organic single crystal (length: 10-1000 μm; width: 0.3-100 μm; thickness: 0.02-10 μm) on the flexible planar embedded lamination electrode obtained from the step 2, thereby forming the organic single crystal field effect circuit, as shown in FIG. 7.

The organic single crystal field effect circuit of the present invention may be attached to an external circuit: covering the organic semiconductor with gold film that serves as a mask, and then attaching the prepared organic single crystal circuit to the external circuit using the method of oxygen plasma: removing the external electrode layer with PDMS from the silicon substrate, and then oxygen plasma treating it for 100 seconds. Covering the organic single crystal with gold film which serves as a mask; then performing oxygen plasma treatment on the surface of the flexible planar embedded lamination electrode with an inverter pattern and the surface of the external electrode layer such that hydroxyl is formed on the surfaces; removing the gold film with a probe station; aligning the lamination electrode layer with organic semiconductor and the external electrode layer using aligned patterns under a microscope, and heating; so that the organic single crystal circuit is finally attached to the external circuit.

Figure 8:
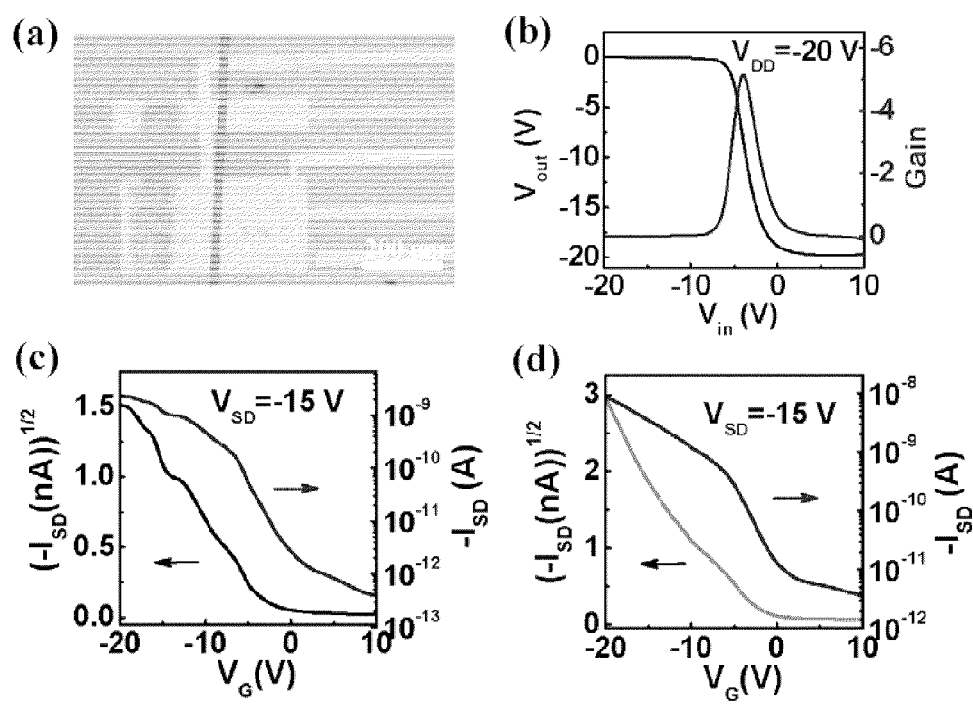
FIG. 8 are physical map and performance curves of an inverter obtained by applying the flexible planar embedded lamination electrodes into the phthalocyanine copper single crystal field effect circuit prepared by embodiment 1 of the present invention.

FIG. 8 are physical map and performance curves of an inverter obtained by applying the flexible planar embedded lamination electrode into the phthalocyanine copper single crystal field effect circuit prepared according to this embodiment, wherein FIG. 8 (a) is a physical map of the phthalocyanine copper single crystal field effect inverter, in which the aspect ration of a drive device and a load device is 1/5; FIG. 8 (b) are output voltage curve and gain curve of the phthalocyanine copper single crystal field effect inverter; FIG. 8 (c) is a transfer curve of the drive device of the phthalocyanine copper single crystal field effect inverter; and FIG. 8 (d) is a transfer curve of the load device of the phthalocyanine copper single crystal field effect inverter.

It can be seen from FIG. 8 (b) that, the phthalocyanine copper single crystal field effect bootstrap inverter has a gain of 5. It can be seen from FIG. 8 (c) that the migration rate of the drive device of the phthalocyanine copper inverter is 0.0089 cm²/Vs. It can be seen from FIG. 8 (*d*) that the migration rate of the load device of the phthalocyanine copper inverter is 0.0037 cm²/Vs. The gain of the phthalocyanine copper organic single crystal field effect inverter prepared with the flexible planar embedded lamination electrode of the present invention is comparable to that of the phthalocyanine copper single crystal field effect inverter reported in the literature (Advanced Materials 2009 21, 4234). It is shown from the above results that, a phthalocyanine copper organic single crystal field circuit with high performance can be prepared through the method of the present invention.

Figure 9:
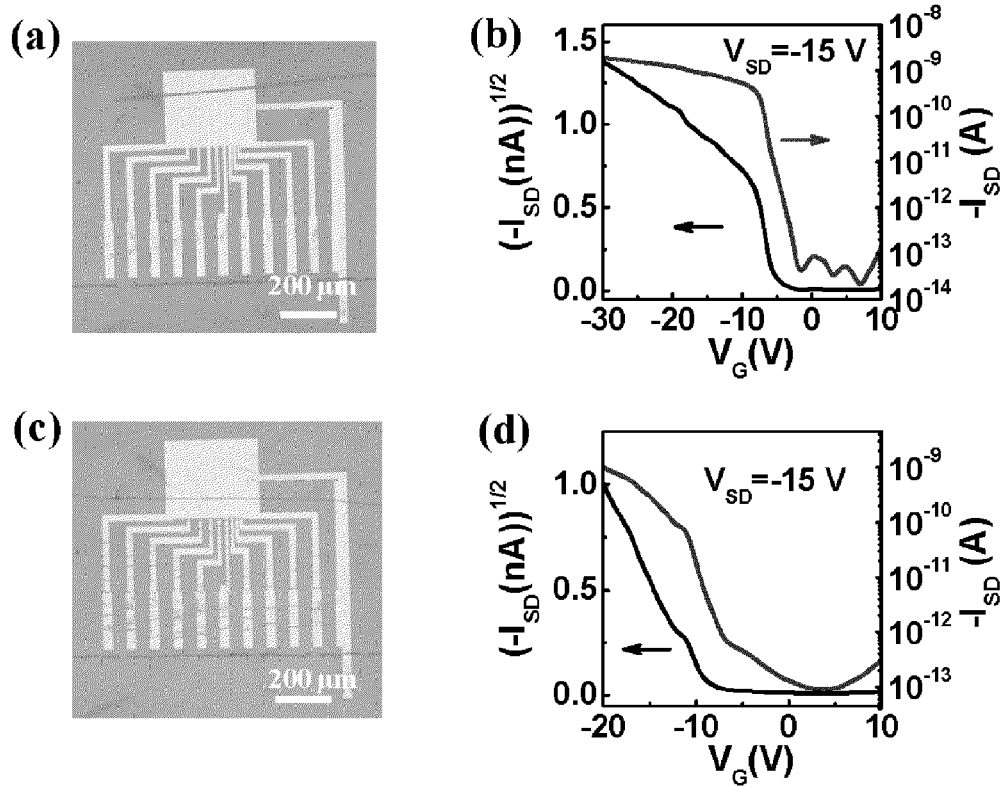
FIG. 9 (a) is a physical map of the phthalocyanine copper single crystal field effect inverter.
Figure 10:
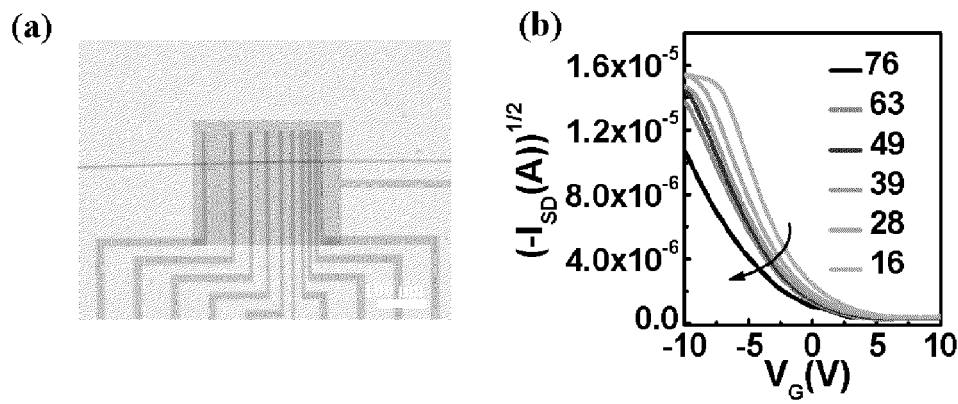
FIG. 10 are microscope figure (FIG. 10 (a)) and transfer curve (FIG. 10 (b)) of a plurality of variable channel devices produced by the flexible planar embedded lamination electrodes prepared by embodiment 1 of the present invention.

For the flexible planar embedded lamination electrode of the organic single crystal field effect transistor prepared in the present invention, since the semiconductor, the electrodes and the insulating layer are bonded through an effect of electrostatic adherence, the organic single crystal may be removed, thus achieving the advantage of reuse of the flexible planar embedded lamination electrode prepared in the present invention. FIG. 9 are microscope figures and transfer curves of the flexible planar embedded lamination electrode applied into the phthalocyanine copper organic single crystal field effect transistor, which may be reused; wherein FIGS. 9 (*a*) and 9 (*b*) are microscope figure and transfer curve of a device on the laminations electrode, respectively, FIGS. 9 (*c*) and 9 (*d*) are a microscope figure and transfer curve of a substituted nanowire of phthalocyanine copper nanowires on the same lamination electrode, respectively. For the flexible planar embedded lamination electrode of organic single crystal field effect transistor prepared according to the present invention, since the process of electrode patterning is prepared through photoetching technology, a pattern with high precision and complexity can be formed. Thus, the fabrication of devices with high integration level can be achieved by using such flexible planar embedded lamination electrode. FIGS. 10 (*a*) and 10 (*b*) show microscope figure and device transfer curves of a plurality of phthalocyanine copper organic single crystal field effect transistors with different channels, respectively, which may be prepared using such planar embedded lamination electrode at once.

Embodiment 2. Preparation of Rubrene Organic Single Crystal Field Effect

Circuit (the Aspect Ratio of a Drive Device and a Load Device in the Rubrene Single Crystal Field Effect Inverter to be Designed is 1/5)

1. Preparation of Circuit Masks (1) Designing circuit mask patterns of source electrode, drain electrode, gate electrode and external electrode, respectively, using L-editor software; wherein each layer is designed to have a same aligning pattern for the following alignment of the plurality of electrodes.

(2) The circuit masks used in the embodiment is commercially available from Nanjing Microclear electronics Technology Co., Ltd., the specific process is: spin-coating polymethyl methacrylate on a quartz, etching the circuit mask patterns obtained from step (1) with laser direct writing; then evaporating chromium and removing the polymethyl methacrylate, thereby obtaining the circuit masks of the source, drain, gate and external electrodes.

2. Preparation of Flexible Planar Embedded Lamination Electrode with Inverter Pattern (1) Modifying a layer of octadecyl trichloro silane OTS on silicon surface of the substrate using liquid-phase method, modifying the silicon surface with octadecyl trichloro silane OTS: firstly cleaning the surface of the substrate; then putting the substrate into piranha solution (i.e., solution of concentrated sulfuric acid and hydrogen peroxide with a volume ratio of 7:3) to form hydroxylation on the surface of the substrate; cleaning the substrate again; putting the substrate into OTS n-heptane solution with a volume ratio of 500:1 such that a layer of OTS is formed on the surface of the substrate.

(2) Preparing a source/drain electrode layer, a gate electrode layer, an external electrode layer of the circuit pattern, respectively, on the OTS-modified substrates using photolithography, and modifying mercaptopropyl trimethoxy silane MPT on the metal electrode surfaces: firstly, photoetching the source/drain electrode and the gate electrode on the substrate with AZ5214E photoresist (baking temperature: 100 degrees, baking time: 3 min, exposure time: 20 seconds, developing time: 60 seconds, fixing time: 30 seconds); and then vacuum evaporating a layer of 25 nm gold (with vacuum level: $10^{-6}$ torr; evaporating rate: 0.01 nm/s); modifying a layer of MPT molecule (5 nm) on the metal surface using vacuum gas-phase method before the photoresist is removed (specifically, simultaneously putting the source, drain, and gate electrodes and 30 μL mercaptopropyl trimethoxy silane into a vacuum system with a pressure of 7000 Pa for 20 min), with the purpose of enabling a good attachment between the polydimethyl siloxane PDMS and the metal, and facilitating the removing of the metal electrodes down from the substrate surface; after the modification of MPT, removing the photoresist with a solution of N-methylpyrrolidone, with the purpose of modifying the MPT only on the metal surface, and the substrate surface has no MPT molecules.

(3) Spin-coating polydimethyl siloxanes (PDMS) with different thicknesses on the source/drain electrode layer, the gate electrode layer and the external electrode layer which have been photoetched and modified with MPT, respectively, and then curing.

Preparing PDMS solution at a ratio of 10:1 (PDMS: curing agent, volume ratio), then standing the solution for 2 hours after stirring. Spin-coating a layer of 200 μm PDMS solution directly on the gate electrode which has been photoetched and modified with MPT, and then putting it into a baking oven for heating and cure at 70 degrees for 12 hours; diluting the PDMS by pouring the stood PDMS into the N-hexane solution, with a volume ratio 1:4, then stirring and standing; spin-coating a layer of n-hexane solution of 1 μm PDMS on the source/drain electrode which has been the photoeched and modified with MPT, and then putting it into an baking oven to heat and cure at 70 degrees for 12 hours.

(4) Oxygen plasma treating the surfaces of the source/drain, gate electrodes: firstly, removing the PDMS with the gate from the silicon substrate; then simultaneously putting the removed gate electrode and the source/drain electrode with PDMS into oxygen plasma for treating for 100 seconds, so that the surfaces, i.e., the surface of gate with metal electrode and the surface of the source/drain electrode with PDMS layer, are hydroxylated.

(5) Adjusting the source/drain electrode: adjusting the source/drain electrode with PDMS using a probe (for a fine electrode), with the purpose of facilitating following tests.

(6) Aligning and heating the gate electrode and the source/drain electrode: aligning the gate electrode and the source/drain electrode under a microscope using an aligning tool (which can achieve up, down, lift and down leveling); putting the aligned electrodes into a baking oven for heating at 70 degrees for 10 minutes, so that an irreversible bond is formed between the gate electrode and the source/drain electrode, making them attached tightly, with this, the PDMS layer of the source/drain electrode and the metal electrode surface of the gate are attached together.

(7) Entirely removing the source/drain electrode with thinner PDMS using the gate electrode with thicker PDMS, which forms a planar embedded lamination electrode. Since the good flexibility of the PDMS and metal, the formed electrodes, insulating layer and the substrate are fully flexible planar embedded lamination electrodes.

3. Preparation of Rubrene Organic Single Crystal Field Effect Circuit

The rubrene organic single crystal (length: 30-5000 μm; width: 0.5-500 μm; thickness: 0.05-30 μm) is placed on the flexible planar embedded lamination electrode obtained from the step 2, thereby forming the organic single crystal field effect circuit, as shown in FIG. 7.

The organic single crystal field effect circuit prepared by the present invention may be attached to an external circuit: covering the organic semiconductor with gold film that serves as a mask, and then attaching the prepared organic single crystal circuit to the external circuit using the method of oxygen plasma: removing the external electrode layer with PDMS down from the silicon substrate, and then oxygen plasma treating it for 100 seconds; performing oxygen plasma treatment on the surface of the flexible planar embedded lamination electrode with an inverter pattern and the surface of the external electrode layer such that hydroxyl is formed on the surfaces; removing the gold film with a probe station; aligning the lamination electrode layer with organic semiconductor and the external electrode layer using aligned patterns under a microscope, and heating, so that the organic single crystal circuit is finally connected to the external circuit.

Figure 11:
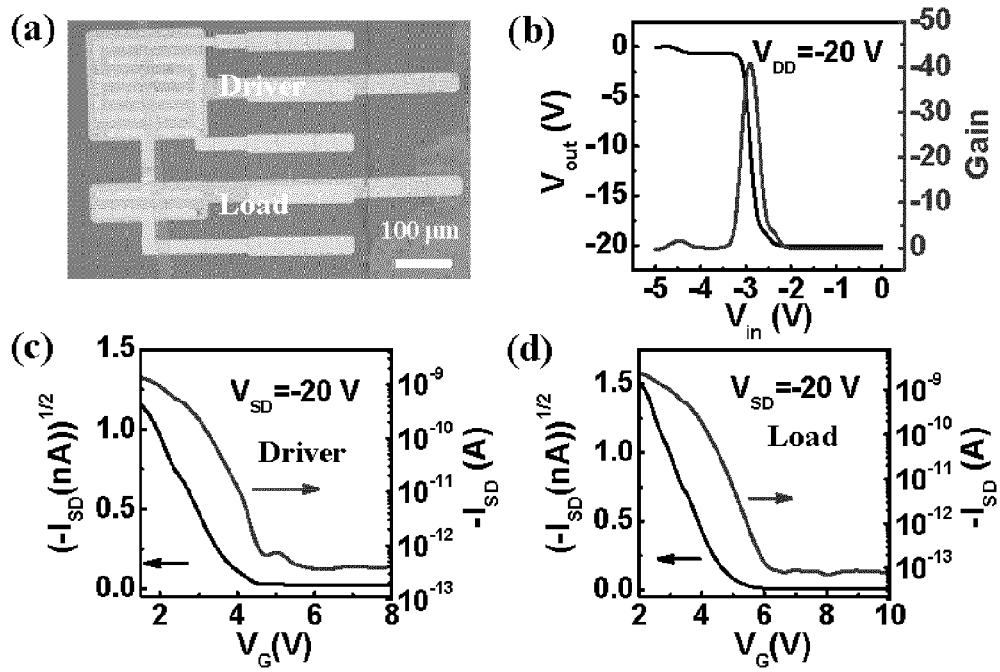
FIG. 11 are physical map and performance curves of an inverter obtained by applying the flexible planar embedded lamination electrodes into the rubrene single crystal field effect circuit prepared by embodiment 2 of the present invention.

FIG. 11 are physical map and performance curves of an inverter obtained by applying the flexible planar embedded lamination electrode into the rubrene single crystal field effect circuit prepared according to this embodiment, wherein FIG. 11 (a) is a physical map of the rubrene single crystal field effect inverter (the aspect ratio of a derive device and a load device is 1/5); FIG. 11 (b) are output voltage curve and gain curve of the rubrene single crystal field effect inverter; FIG. 11 (c) is a transfer curve of the drive device of the rubrene single crystal field effect inverter; and FIG. 11 (d) is a transfer curve of the load device of the rubrene single crystal field effect inverter.

It can be seen from FIG. 11 (b) that the gain of the rubrene single crystal field effect bootstrap inverter is 44. It can be seen from FIG. 11 (c) that the migration rate of the drive device of the rubrene inverter is 2.47 $cm^2/Vs$. It can be seen from FIG. 11 (d) that the migration rate of the load device of the rubrene inverter is 0.676 $cm^2/Vs$. The rubrene organic single crystal field effect bootstrap inverter is prepared by the present invention for the first time. It is shown from the above results that a rubrene organic single crystal field circuit with high performance can be prepared by the method of the present invention.

Embodiment 3. Preparation of Rubrene Organic Single Crystal Field Effect

Circuit (the Aspect Ratio of a Drive Device and a Load Device of the Rubrene Single Crystal Field Effect Inverter to be Designed is 2/5)

1. Preparation of Circuit Masks (1) Designing circuit mask patterns of source electrode, drain electrode, gate electrode and external electrode, respectively, using L-editor software; wherein each layer is designed to have a same aligning pattern for the following alignment of the plurality of electrodes.

(2) The circuit masks used in the embodiment is commercially available from Nanjing Microclear electronics Technology Co., Ltd., the specific process is: spin-coating polymethyl methacrylate on a quartz, etching the circuit mask patterns obtained from step (1) with laser direct writing; then evaporating chromium and removing the polymethyl methacrylate, thereby obtaining the circuit masks of the source, drain, gate and external electrodes.

2. Preparation of Flexible Planar Embedded Lamination Electrode with Inverter Pattern (1) Modifying a layer of octadecyl trichloro silane OTS on silicon surface of the substrate using liquid-phase method, modifying the silicon surface with octadecyl trichloro silane OTS: firstly cleaning the surface of the substrate; then putting the substrate into piranha solution (i.e., solution of concentrated sulfuric acid and hydrogen peroxide with a volume ratio of 7:3) to form hydroxylation on the surface of the substrate; cleaning the substrate again; putting the substrate into OTS n-heptane solution with a volume ratio of 500:1 such that a layer of OTS is formed on the surface of the substrate.

(2) Preparing a source/drain electrode layer, a gate electrode layer, an external electrode layer of the circuit pattern, respectively, on the OTS-modified substrates using photolithography, and modifying mercaptopropyl trimethoxy silane MPT on the metal electrode surfaces: firstly, photoetching the source/drain electrode and the gate electrode on the substrate with AZ5214E photoresist (baking temperature: 100 degrees, baking time: 3 min, exposure time: 20 seconds, developing time: 60 seconds, fixing time: 30 seconds); and then vacuum evaporating a layer of 25 nm gold (with vacuum level: $10^{-6}$ torr; evaporating rate: 0.01 nm/s); modifying a layer of MPT molecule (1-5 nm) on the metal surface using vacuum gas-phase method before the photoresist is removed (specifically, simultaneously putting the source, drain, and gate electrodes and 30 μL mercaptopropyl trimethoxy silane into a vacuum system with a pressure of 7000 Pa for 20 min), with the purpose of enabling a good attachment between the polydimethyl siloxane PDMS and the metal, and facilitating the removing of the metal electrodes down from the substrate surface; after the modification of MPT, removing the photoresist with a solution of N-methylpyrrolidone, with the purpose of modifying the MPT only on the metal surface, and the substrate surface has no MPT molecules.

(3) Spin-coating polydimethyl siloxanes (PDMS) with different thicknesses on the source/drain electrode layer, the gate electrode layer and the external electrode layer which have been photoetched and modified with MPT, respectively, and then curing.

Preparing PDMS solution at a ratio of 10:1 (PDMS: curing agent, volume ratio), then standing the solution for 2 hours after stirring. Spin-coating a layer of 200 μm PDMS solution directly on the gate electrode which has been photoetched and modified with MPT, and then putting it into a baking oven for heating and cure at 70 degrees for 12 hours; diluting the PDMS by pouring the stood PDMS into the N-hexane solution, with a volume ratio 1:4, then stirring and standing; spin-coating a layer of n-hexane solution of 1 μm PDMS on the source/drain electrode which has been the photoeched and modified with MPT, and then putting it into an baking oven to heat and cure at 70 degrees for 12 hours.

(4) Oxygen plasma treating the surfaces of the source/drain, gate electrodes: firstly, removing the PDMS with the gate from the silicon substrate; then simultaneously putting the removed gate electrode and the source/drain electrode with PDMS into oxygen plasma for treating for 100 seconds, so that the surfaces, i.e., the surface of gate with metal electrode and the surface of the source/drain electrode with PDMS layer, are hydroxylated.

(5) Adjusting the source/drain electrode: adjusting the source/drain electrode with PDMS using a probe (for a fine electrode), with the purpose of facilitating following tests.

(6) Aligning and heating the gate electrode and the source/drain electrode: aligning the gate electrode and the source/drain electrode under a microscope using an aligning tool (which can achieve up, down, lift and down leveling); putting the aligned electrodes into a baking oven for heating at 70 degrees for 10 minutes, so that an irreversible bond is formed between the gate electrode and the source/drain electrode, making them attached tightly, with this, the PDMS layer of the source/drain electrode and the metal electrode surface of the gate are attached together.

(7) Entirely removing the source/drain electrode with thinner PDMS using the gate electrode with thicker PDMS, which forms a planar embedded lamination electrode. Since the good flexibility of the PDMS and metal, the formed electrodes, insulating layer and the substrate are fully flexible planar embedded lamination electrodes.

3. Preparation of Rubrene Organic Single Crystal Field Effect Circuit

The rubrene organic single crystal (length: 30-5000 μm; width: 0.5-500 μm; thickness: 0.05-30 μm) is placed on the flexible planar embedded lamination electrode obtained from the step 2, thereby forming the organic single crystal field effect circuit, as shown in FIG. 7.

The organic single crystal field effect circuit prepared by the present invention may be attached to an external circuit: covering the organic semiconductor with gold film that serves as a mask, and then attaching the prepared organic single crystal circuit to the external circuit using the method of oxygen plasma: removing the external electrode layer with PDMS down from the silicon substrate, and then oxygen plasma treating it for 100 seconds; performing oxygen plasma treatment on the surface of the flexible planar embedded lamination electrode with an inverter pattern and the surface of the external electrode layer such that hydroxyl is formed on the surfaces; removing the gold film with a probe station; aligning the lamination electrode layer with organic semiconductor and the external electrode layer using aligned patterns under a microscope, and heating, so that the organic single crystal circuit is finally connected to the external circuit.

Figure 12:
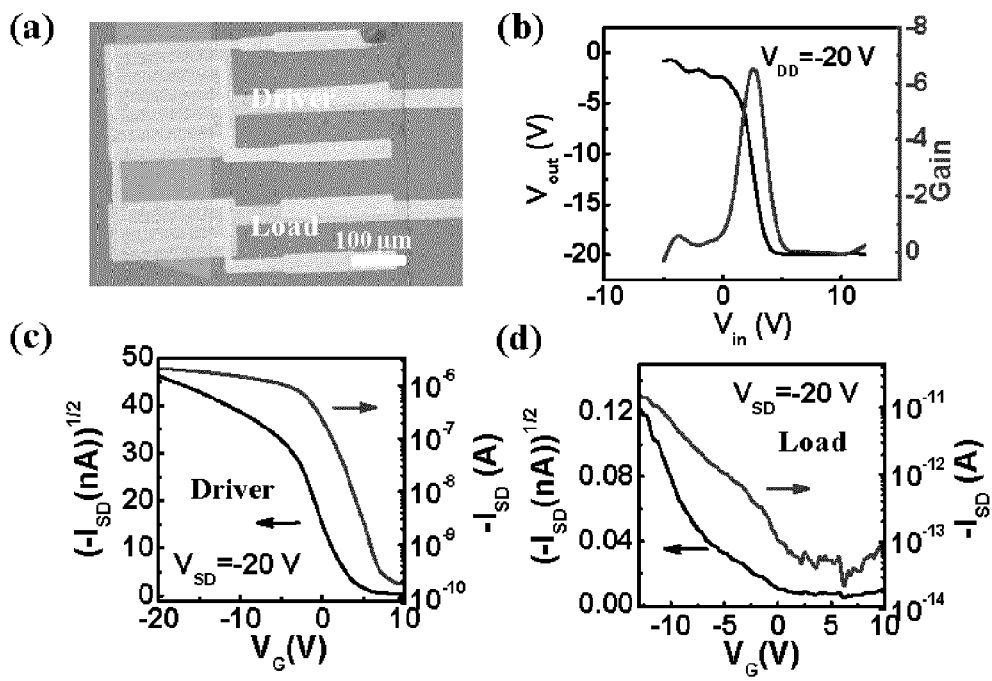
FIG. 12 are physical map and performance curves of an inverter obtained by applying the flexible planar embedded lamination electrode into the rubrene single crystal field effect circuit prepared according to embodiment 3 of the present invention.

FIG. 12 are physical map and performance curves of an inverter obtained by applying the flexible planar embedded lamination electrode into the rubrene single crystal field effect circuit prepared by this embodiment, wherein FIG. 12 (a) is a physical map of the rubrene single crystal field effect inverter (the aspect ratio of a derive device and a load device is 1/5); FIG. 12 (b) are output voltage curve and gain curve of the rubrene single crystal field effect inverter; FIG. 12 (c) is a transfer curve of the drive device of the rubrene single crystal field effect inverter; and FIG. 12 (d) is a transfer curve of the load device of the rubrene single crystal field effect inverter.

It can be seen from FIG. 12 (b) that the gain of the rubrene single crystal field effect bootstrap inverter is 7. It can be seen from FIG. 12 (c) that the migration rate of the drive device of the rubrene inverter is 7.943 cm$^2$/Vs. It can be seen from FIG. 12 (d) that the migration rate of the load device of the rubrene inverter is 2.34×10$^{-5}$ cm$^2$/Vs. The rubrene organic single crystal field effect bootstrap inverter is prepared by the present invention for the first time. It is shown from the above results that a rubrene organic single crystal field circuit with high-performance can be prepared by the method of the present invention.

Embodiment 4. Preparation of Rubrene Organic Single Crystal Flexible Field Effect Circuit 1. Preparation of Circuit Masks (1) Designing circuit mask patterns of source electrode, drain electrode, gate electrode and external electrode, respectively, using L-editor software; wherein each layer is designed to have a same aligning pattern for the following alignment of the plurality of electrodes.

(2) The circuit masks used in the embodiment is commercially available from Nanjing Microclear electronics Technology Co., Ltd., the specific process is: spin-coating polymethyl methacrylate on a quartz, etching the circuit mask patterns obtained from step (1) with laser direct writing; then evaporating chromium and removing the polymethyl methacrylate, thereby obtaining the circuit masks of the source, drain, gate and external electrodes.

2. Preparation of Flexible Planar Embedded Lamination Electrode with Inverter Pattern (1) Modifying a layer of octadecyl trichloro silane OTS on silicon surface of the substrate using liquid-phase method, modifying the silicon surface with octadecyl trichloro silane OTS: firstly cleaning the surface of the substrate; then putting the substrate into piranha solution (i.e., solution of concentrated sulfuric acid and hydrogen peroxide with a volume ratio of 7:3) to form hydroxylation on the surface of the substrate; cleaning the substrate again; putting the substrate into OTS n-heptane solution with a volume ratio of 1000:1 such that a layer of OTS is formed on the surface of the substrate.

(2) Preparing a source/drain electrode layer, a gate electrode layer, an external electrode layer of the circuit pattern, respectively, on the OTS-modified substrates using photolithography, and modifying mercaptopropyl trimethoxy silane MPT on the metal electrode surfaces: firstly, photoetching the source/drain electrode and the gate electrode on the substrate with AZ5214E photoresist (baking temperature: 100 degrees, baking time: 3 min, exposure time: 20 seconds, developing time: 60 seconds, fixing time: 30 seconds); and then vacuum evaporating a layer of 25 nm gold (with vacuum level: 10$^{-6}$ torr; evaporating rate: 0.01 nm/s); modifying a layer of MPT molecule (5 nm) on the metal surface using vacuum gas-phase method before the photoresist is removed (specifically, simultaneously putting the source, drain, and gate electrodes and 30 μL mercaptopropyl trimethoxy silane into a vacuum system with a pressure of 7000 Pa for 20 min), with the purpose of enabling a good attachment between the polydimethyl siloxane PDMS and the metal, and facilitating the removing of the metal electrodes down from the substrate surface; after the modification of MPT, removing the photoresist with a solution of N-methylpyrrolidone, with the purpose of modifying the MPT only on the metal surface, and the substrate surface has no MPT molecules.

(3) Spin-coating polydimethyl siloxanes (PDMS) with different thicknesses on the source/drain electrode layer, the gate electrode layer and the external electrode layer which have been photoetched and modified with MPT, respectively, and then curing.

Preparing PDMS solution at a ratio of 10:1 (PDMS: curing agent, volume ratio), then standing the solution for 2 hours after stirring. Spin-coating a layer of 200 µm PDMS solution directly on the gate electrode which has been photoetched and modified with MPT, and then putting it into a baking oven for heating and cure at 70 degrees for 12 hours; diluting the PDMS by pouring the stood PDMS into the N-hexane solution, with a volume ratio 1:4, then stirring and standing; spin-coating a layer of n-hexane solution of 1 µm PDMS on the source/drain electrode which has been the photoeched and modified with MPT, and then putting it into an baking oven to heat and cure at 70 degrees for 12 hours.

(4) Oxygen plasma treating the surfaces of the source/drain, gate electrodes: firstly, removing the PDMS with the gate from the silicon substrate; then simultaneously putting the removed gate electrode and the source/drain electrode with PDMS into oxygen plasma for treating for 100 seconds, so that the surfaces, i.e., the surface of gate with metal electrode and the surface of the source/drain electrode with PDMS layer, are hydroxylated.

(5) Adjusting the source/drain electrode: adjusting the source/drain electrode with PDMS using a probe (for a fine electrode), with the purpose of facilitating following tests.

(6) Aligning and heating the gate electrode and the source/drain electrode: aligning the gate electrode and the source/drain electrode under a microscope using an aligning tool (which can achieve up, down, lift and down leveling); putting the aligned electrodes into a baking oven for heating at 70 degrees for 10 minutes, so that an irreversible bond is formed between the gate electrode and the source/drain electrode, making them attached tightly, with this, the PDMS layer of the source/drain electrode and the metal electrode surface of the gate are attached together.

(7) Entirely removing the source/drain electrode with thinner PDMS using the gate electrode with thicker PDMS, which forms a planar embedded lamination electrode. Since the good flexibility of the PDMS and metal, the formed electrodes, insulating layer and the substrate are fully flexible planar embedded lamination electrodes.

3. Preparation of Flexible Rubrene Organic Single Crystal Field Effect Circuit on a Spherical Surface The fully flexible planar embedded lamination electrode obtained from the step 2 is attached onto a spherical surface. Then the rubrene organic single crystal (length: 30-5000 µm; width: 0.5-500 µm; thickness: 0.05-30 µm) is placed on the flexible planar embedded lamination electrode which is attached onto the spherical surface, thereby forming the flexible organic single crystal field effect circuit on the spherical surface.

Figure 13:
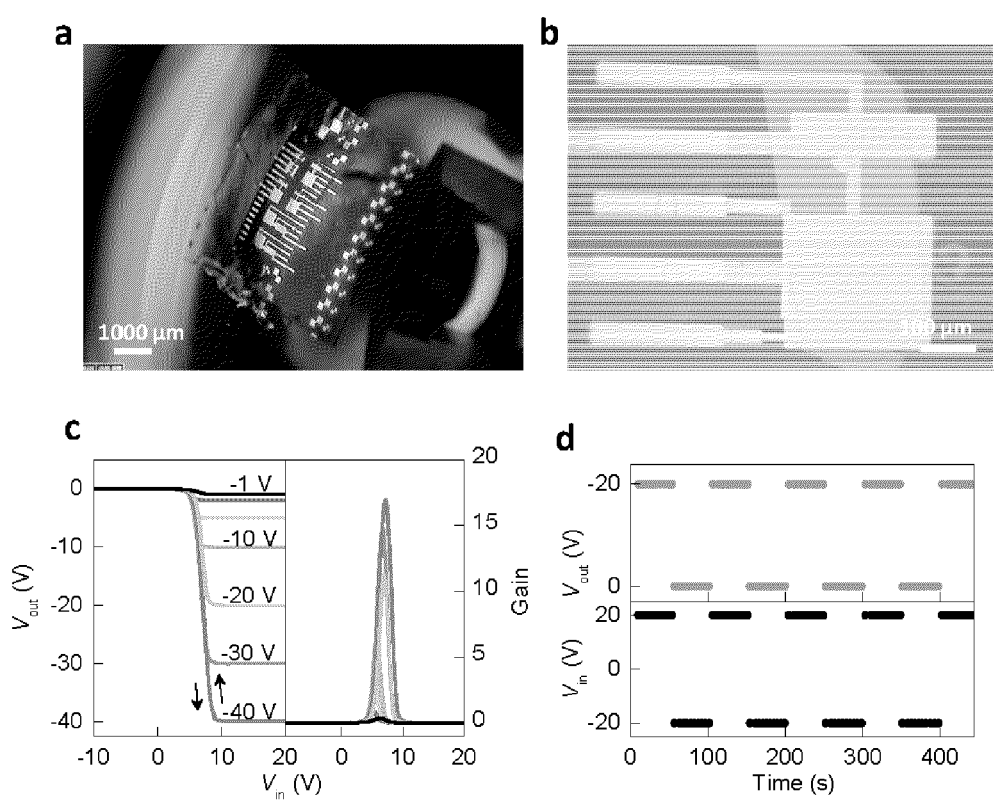
FIG. 13 shows a rubrene single crystal flexible inverter prepared on a spherical surface in embodiment 4 of the present invention.

FIG. 13 are physical map and performance curves of an inverter obtained by applying the flexible planar embedded lamination electrode into the flexible rubrene single crystal field effect circuit prepared by this embodiment, wherein FIG. 13 (a) is a three-dimensional microscope figure of the flexible rubrene single crystal field effect inverter; FIG. 13 (b) is an enlarged microscope figure of the flexible rubrene single crystal field effect inverter; FIG. 13 (c) are voltage output curve and the gain curve of the flexible rubrene single crystal field effect inverter; and FIG. 13 (d) is dynamic output curve of the flexible rubrene single crystal field effect inverter.

It can be seen from FIG. 13 (c) that the gain of the rubrene single crystal field effect bootstrap inverter is 16.7. The flexible rubrene organic single crystal field effect bootstrap inverter is prepared by the present invention for the first time. It is indicated from the above results that a flexible rubrene organic single crystal field circuit with high-performance can be prepared by the method of the present invention.

INDUSTRIAL APPLICATIONS

The organic single crystal field effect circuit of the present invention is a flexible organic single crystal field effect circuit with high performance in that electrodes are embedded electrodes that are located in the same plane as the insulating layer and are flexible such that a complete fit between the electrodes, the insulating layer and the organic single crystal can be achieved; the preparation method provided in the present invention can be operated at a room temperature such that the organic semiconductor is free from damage of thermal radiation; the method provided in the present invention prepares electrodes using photolithography technique with high precision such that patterns with high precision and high complexity can be prepared, thereby achieving high integration level and easy-to-use; the method provided in the present invention can achieve the preparation of a flexible circuit.

What is claimed is:

1. A preparation method for an organic signal crystal field effect circuit, comprising steps of:
   (1) preparing circuit masks, comprising steps of:
      1) designing circuit mask patterns of a source electrode, a drain electrode and a gate electrode, respectively using L-editor software;
      2) etching, on quartz or glass spin-coated with polymethyl methacrylate, the circuit mask patterns obtained from the step 1) with a method of laser direct writing;
      evaporating chromium, and
      removing the polymethyl methacrylate, to obtain the circuit masks of the source, drain electrode and gate electrodes;
   (2) preparing a flexible planar embedded lamination electrode with the circuit patterns, comprising steps of:
      1) attaching octadecyl trichlorosilane on surface of a substrate;
      2) preparing the source, drain and gate electrodes, respectively, on the substrate modified by step 1), by means of photolithography and the circuit masks obtained from step (1); and
      attaching mercaptopropyl trimethoxysilane on metal electrode surfaces of the source, drain and gate electrodes;
      3) spin-coating polydimethyl siloxane on surfaces of the source, drain and gate electrodes obtained from step 2), respectively, wherein the surface of the gate electrode is spin-coated using thicker polydimethyl siloxane, and the surfaces of the source and drain electrodes are spin-coated using thinner polydimethyl siloxane, and
      curing;
      4) removing the gate electrode spin-coated with polydimethyl siloxane from the substrate;
      performing oxygen plasma treatment on the metal electrode surface of the gate electrode and polydimethyl siloxane surfaces of the source and drain electrodes, respectively, and
      thereby forming hydroxyl on the surfaces;
      5) adjusting the source and drain electrodes;
      aligning and heating the metal electrode surface of the gate electrode and the polydimethyl siloxane surfaces of the source and drain electrodes to attach the gate, source and drain electrodes into an integration,
      entirely removing the source and drain electrodes with thinner polydimethyl siloxane using the gate electrode with thicker polydimethyl siloxane, and thereby obtaining the flexible planar embedded lamination electrode;

(3) preparing the organic single crystal field effect circuit, comprising steps of:

placing the organic single crystal on the flexible planar embedded lamination electrode obtained from the step (2), and thereby obtaining the organic single crystal field effect circuit.

2. The preparation method of claim 1, wherein in the step (2) 1), the steps of attaching octadecyl trichlorosilane are as follows:

placing the cleaned substrate into a mixed solution of concentrated sulfuric acid and hydrogen peroxide with a volume ratio of 7:3;

cleaning the substrate, placing the substrate into a mixed solution of n-heptane and octadecyl trichlorosilane with a volume ratio of 1000:1, and thereby attaching the octadecyl trichlorosilane on the surface of the substrate.

3. The preparation method of claim 1, wherein in the step (2) 2), the steps of photolithography are as follows:

spin-coating photoresist on the substrate, exposing the substrate to a ultraviolet light of 365 nm after heating, and evaporating metal after sequentially performing developing and fixing.

4. The preparation method of claim 1, wherein in the step (2) 3), the thickness of the polydimethyl siloxane spin-coated on the gate electrode is 50-500 μm;

the thickness of the polydimethyl siloxane spin-coated on the source and drain electrodes is 0.8-5 μm;

the temperature for curing is 70-100° C., and the time for curing is 12-2 h.

5. The preparation method of claim 1, wherein in the step (2) 4), the time for oxygen plasma treatment is 10-60 seconds.

6. The preparation method of claim 1, wherein in the step (2) 5), the temperature for heating is 70-100° C., and the time for heating is 10-30 min.

7. The preparation method of claim 1, wherein the organic single crystal is phthalocyanine copper organic single crystal or rubrene organic single crystal.

8. An organic single crystal field effect circuit prepared by the preparation method of claim 1.

9. A preparation method for a flexible organic single crystal field effect circuit, comprising steps of: in the preparation method of claim 1, the step (3) further comprises:

affixing the flexible planar embedded lamination electrode to a spherical surface before placing the organic single crystal on the flexible planar embedded lamination electrode obtained from the step (2), and thereby obtaining the flexible organic single crystal field effect circuit.

10. A flexible organic single crystal field effect circuit prepared by the preparation method of claim 9.

* * * * *